(12) United States Patent
Kagoshima et al.

(10) Patent No.: US 10,184,182 B2
(45) Date of Patent: Jan. 22, 2019

(54) PLASMA PROCESSING APPARATUS (71) Applicant: Hitachi High-Technologies Corporation, Minato-ku, Tokyo (JP)

(72) Inventors: Akira Kagoshima, Tokyo (JP); Daisuke Shiraishi, Tokyo (JP); Yuji Nagatani, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 452 days.

(21) Appl. No.: 14/834,389

(22) Filed: Aug. 24, 2015

(65) Prior Publication Data

US 2016/0155611 A1 Jun. 2, 2016

(30) Foreign Application Priority Data

Nov. 27, 2014 (JP) ................................. 2014-239439

(51) Int. Cl.
*H01J 37/32* (2006.01)
*C23C 16/52* (2006.01)
*C23C 16/50* (2006.01)

(52) U.S. Cl.
CPC .............. *C23C 16/52* (2013.01); *C23C 16/50* (2013.01); *H01J 37/32908* (2013.01); *H01J 37/32926* (2013.01); *H01J 37/32935* (2013.01)

(58) Field of Classification Search
CPC ........... H01J 37/32009; H01J 2237/334; H01J 37/32926; H01J 37/32935; H01J 37/32908; C23C 16/50; C23C 16/52
See application file for complete search history.

(56) References Cited

U.S. PATENT DOCUMENTS

| 2003/0003607 A1* | 1/2003 | Kagoshima | ...... G05B 19/41875 438/14 |
| 2005/0189070 A1 | 9/2005 | Tanaka et al. | |
| 2009/0229635 A1* | 9/2009 | Numakura | ........ H01L 21/67028 134/18 |

FOREIGN PATENT DOCUMENTS

| JP | 2005-244065 A | 9/2005 |
| JP | 2011-003712 A | 1/2011 |
| JP | 2011-082441 A | 4/2011 |
| JP | 2011-233721 A | 11/2011 |
| KR | 2014-0031949 A | 3/2014 |

OTHER PUBLICATIONS

Office Action dated Jul. 20, 2016 for related Korean Application No. 10-2015-0105988.
Office Action dated Apr. 17, 2018 for Japanese Patent Application No. 2014-239439.

* cited by examiner

*Primary Examiner* — Yuechuan Yu
(74) *Attorney, Agent, or Firm* — Miles & Stockbridge P.C.

(57) ABSTRACT

A plasma processing apparatus, to which process control such as APC is applied, includes: a processing chamber in which plasma processing is performed on a sample; and a plasma processing control device which performs control to optimize a condition for plasma processing which recovers the status inside a processing chamber, in which plasma processing is performed, based on a waiting time from the time when plasma processing for a second lot, which is a lot immediately before a first lot, is completed to the time when plasma processing for the first lot is started, and the content of plasma processing for the second lot.

9 Claims, 6 Drawing Sheets

PLASMA PROCESSING APPARATUS

BACKGROUND OF THE INVENTION

The present invention relates to a plasma processing apparatus and, more particularly, to a plasma processing apparatus that performs plasma etching using plasma.

In a dry etching apparatus, the environment in the processing chamber changes along with the process history due to deposition of a reaction product between a wafer and etching gas on the inner wall of the processing chamber, change in temperature of parts associated with the processing chamber, consumption of the parts, and the like. Recently, as semiconductor devices are miniaturized, margins for the etching process become narrower and such a change in the environment in the processing chamber considerably affects the process results. It should be noted that this environmental change is not limited to a dry etching apparatus but is also true of other plasma processing apparatuses that perform processing using plasma.

To solve the problem described above, the process control technology, called Advanced Process Control (APC, hereinafter called an APC), has been widely applied. APC is a technology for feedback controlling or feed-forward controlling of recipes (processing conditions) of a next lot or wafer based on monitoring values during processings and/or process results to reduce process variations and to yield stable process results. In particular, the control of correcting a recipe for each wafer processing is called the Run-to-Run control or Wafer-to-Wafer control; hereinafter, these controls are also included in APC.

To implement APC, there is provided a technology described in JP-A-2011-082441. The technology described in this prior-art document is that, for a change in the process environment that cannot be acquired by monitoring process alone, certain amounts of an offset (an amount of a long-term shift and an amount of a short-term shift) are applied to each recipe to reduce a variation in the process result over time.

There is also provided a technology, described in JP-A-2011-003712, for reducing the effects of process variations to yield stable process results. This prior-art document describes a technology in which weighting coefficients as offset values used in creating the process conditions in the feed-forward control are made larger for a longer elapsed time.

SUMMARY OF THE INVENTION

To stabilize dry etching processing on a product wafer, various types of stabilization processings are used, including aging and plasma cleaning performed for each lot, in-situ cleaning performed between product processings, and post-lot cleaning performed at the time of completion of a lot. Recipes for these stabilization processings are composed of conditions at which the processing chamber is cleaned and/or conditions at which the processing chamber is stabilized through running-in discharge; they perform the function of resetting the environmental conditions in the processing chamber for each lot.

However, in the time period from the time when the processing for the preceding lot is completed to the time when the next lot is transferred to the processing chamber and the plasma processing is started (hereinafter called a waiting time), no plasma is generated in the processing chamber, and during this period temperatures of parts in the processing chamber, which were raised during plasma processings, drop as the time elapses. Then, the temperatures of the parts in the processing chamber change the plasma reaction such as an increase/decrease in an amount of deposition in the subsequent processes and exert significant influences on the process results. In addition, the recipes processed in the past cause differences in the amount of deposition on the inner wall of the processing chamber or the like, thus affecting the aging that will be performed later.

Therefore, a difference in the waiting time until the time when the processing of the lot is started or the recipes processed in the past causes a variation in the effect of stabilization processing such as aging and, as a result, further affects a product wafer that will be processed later, so that a stable process result cannot be obtained. Conversely, if the recipe (processing conditions) of stabilization processing such as aging can be optimized according to the difference in the waiting time and/or the recipes processed in the past, a variation in the effect of stabilization processing can be reduced, thereby realizing stable production.

For example, correcting the etching time in the temperature raising step of the aging or correcting the amount of gas flow used for cleaning in the plasma cleaning step by referencing the past process history leads to the stabilization of the environment in the processing chamber and, therefore, to stabilization of the process result of the product wafers to be processed subsequently. Instead of the aging, it is also possible to directly correct the recipe of the product wafers, which will be processed subsequently, depending on differences in the waiting time or the recipes processed in the past, thereby stabilizing the process result of the product wafers.

According to the technology described in JP-A-2011-082441, even though the same amount of the offset can be applied to each of the recipes, a variation in the process environment (an atmosphere in the processing chamber) that varies according to differences in the recipes processed in the past cannot be treated. The temperatures of parts in the processing chamber may determine the amount of deposition of process gases or reaction products in the processing chamber, sometimes resulting in a variation in the process result.

For example, when the plasma source power for generating plasma is large in the recipe processed immediately before, parts in the processing chamber are sufficiently heated. Then, even when there is a plenty of the waiting time of the processing chamber before the next processing, the temperatures of parts do not fall significantly and, therefore, an effect on the processing would be small. However, when the plasma source power is small in the recipe processed immediately before, the parts in the processing chamber are not sufficiently heated and the waiting time of the processing chamber, which is not a problem in the former case, has a significant effect on the processing.

As another example, the effect on the processing differs largely between a processing in a gas chemistry where the amount of deposition on the inner wall of the processing chamber is large and a processing in a gas chemistry to plasma-clean the inner wall of the processing chamber in the recipes processed in the past.

According to the technology described in JP-A-2011-003712, the weighting coefficients that vary according to the elapsed time of processing are adopted, but the process environment that varies according to the differences in the process conditions processed in the past is not taken into consideration. Namely, even when the elapsed time of processing is the same, a change in the atmosphere in the processing chamber that is generated due to differences in the recipes processed in the past cannot be treated. In addition, because the atmosphere in the processing chamber is also changed by the waiting time of the processing chamber, gas species and the amount of gas flow used for the processing, or the like, there are many cases which can't be treated by the weighting coefficients alone, which are changed according to the elapsed time of processing.

In view of the foregoing, the present invention provides a plasma processing apparatus that has a process control technology for obtaining a stable process result in an apparatus to which process control such as APC is applied.

The present invention provides a plasma processing apparatus which performs plasma processing on a lot, which is a collection of one or more samples, using control to reduce a variation in plasma processing with feedback control or feed-forward control, the plasma processing apparatus including: a processing chamber in which plasma processing is performed on a sample; and a plasma processing control device which performs control to optimize a condition for recovery of an inside of a processing chamber for a first lot based on a waiting time and a content of plasma processing for a second lot, the first lot being a lot for which plasma processing is to be performed, the second lot being a lot for which plasma processing is already performed before the first lot, the waiting time being a time period from a time when plasma processing for the second lot is completed to a time when plasma processing for the first lot is started, the condition for recovery of an inside of a processing chamber for the first lot being plasma processing for recovering a status inside a processing chamber in which plasma processing is performed.

Also, the present invention provides a plasma processing apparatus which performs plasma processing on a lot, which is a collection of one or more samples, using control to reduce a variation in plasma processing with feedback control or feed-forward control, the plasma processing apparatus including: a processing chamber in which plasma processing is performed on a sample; and a plasma processing control device which performs control to optimize a plasma processing condition for a first lot based on a waiting time and a content of plasma processing for a second lot, the first lot being a lot for which plasma processing is to be performed, the second lot being a lot for which plasma processing is already performed before the first lot, the waiting time being a time period from a time when plasma processing for the second lot is completed to a time when plasma processing for the first lot is started.

In addition, the present invention provides a plasma processing system which performs plasma processing on a lot, which is a collection of one or more samples, using control to reduce a variation in plasma processing with feedback control or feed-forward control, the plasma processing system performing control to optimize a condition for recovery of an inside of a processing chamber for a first lot based on a waiting time and a content of plasma processing for a second lot, the first lot being a lot for which plasma processing is to be performed, the second lot being a lot for which plasma processing is already performed before the first lot, the waiting time being a time period from a time when plasma processing for the second lot is completed to a time when plasma processing for the first lot is started, the condition for recovery of an inside of a processing chamber for the first lot being plasma processing for recovering a status inside a processing chamber in which plasma processing is performed.

The present invention, which has the configuration described above, allows an apparatus, to which process control such as APC is applied, to yield a stable process result.

Other objects, features, and advantages of the invention will become apparent from the following description of the embodiments of the invention taken in conjunction with the accompanying drawings.

DESCRIPTION OF THE EMBODIMENTS

Hereinafter, respective embodiments of the present invention are described with reference to the drawings.

Embodiment 1

Figure 1:
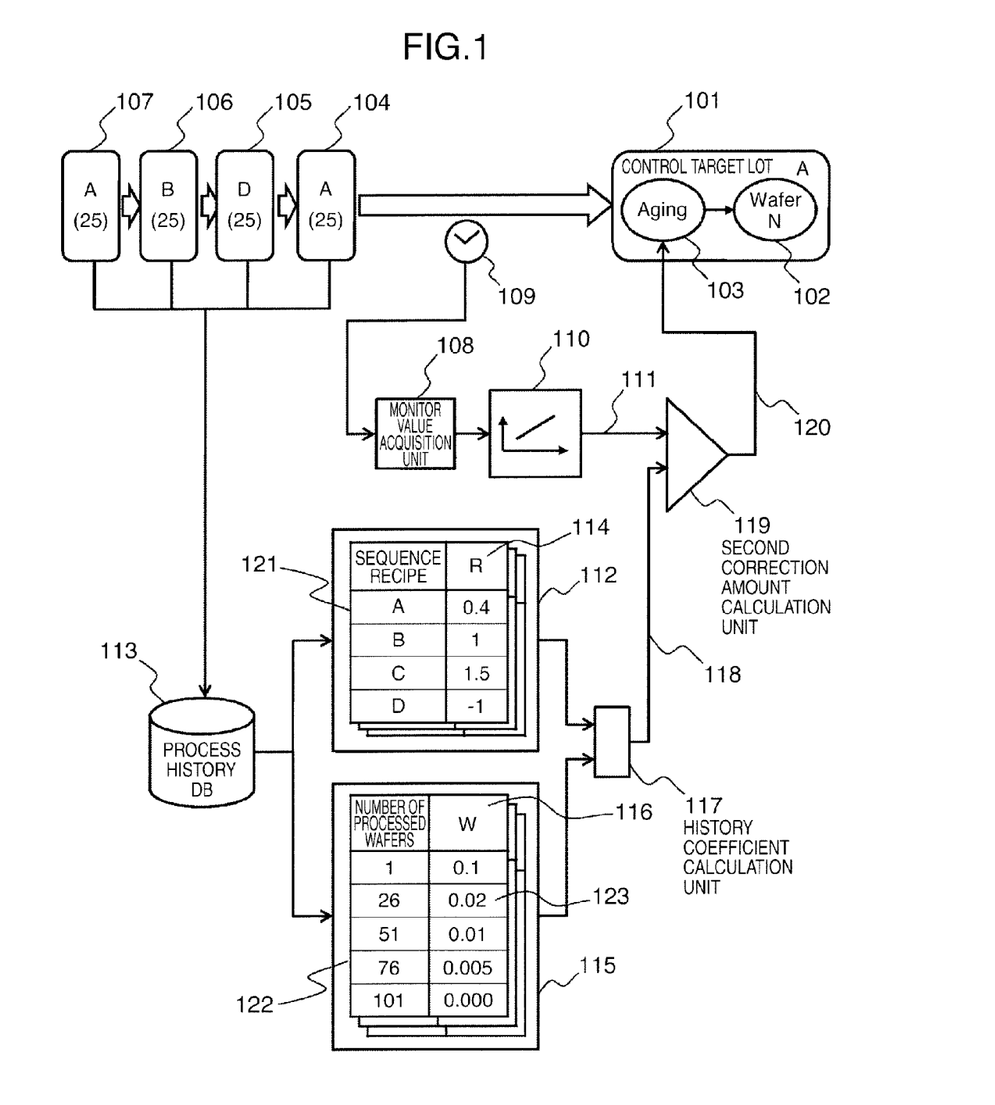
FIG. 1 is a diagram showing a concept of a control system when the present invention is applied to plasma processing.

FIG. 1 is a diagram showing an embodiment of plasma etching process control when the present invention is applied to plasma etching process in a semiconductor fabrication line. A control target lot 101 is a lot for which a processing is to be performed and to which APC is applied. The lot processing includes plasma processing on a plurality of product wafers 102 and aging 103 to perform pre-processing for the product wafers. Incidentally, a lot refers to a collection of one product wafer 102 or a plurality of product wafers 102.

In addition to the one described above, the processing configuring a lot includes an in-situ cleaning processing performed between product wafer processings and a post-lot cleaning performed after the product lot processings are completed. For each of these plasma processings, plasma processing conditions for the apparatus, called a recipe, are determined.

A sequence of respective processings configuring a lot and parameters for each processing are also determined; in this embodiment, the aging 103, which is a pre-processing, is performed first, then a product wafer 102 is processed, and, after that, all the other product wafers included in the lot are processed repeatedly. In this way, conditions, which determine the sequence of plasma processings and the parameters for each of the plasma processings, are determined for each lot to be processed; in this embodiment, these conditions are called a sequence recipe. Although this sequence recipe is used in this embodiment to identify a control target lot or a lot processed in the past, the recipe for each plasma processing may also be used.

In this embodiment, let A be the sequence recipe of the control target lot 101. In addition, a target of correcting a recipe is the aging 103 that is performed before the product wafer processing in order to stabilize the processing chamber. Although the aging is the target of recipe correction in this embodiment, a product wafer or other stabilization processing (such as the in-situ cleaning or the post-lot cleaning) may be used as a target in some cases. Namely, in the present invention, a plasma processing which is performed to recover a condition in the processing chamber where plasma processing is performed on the product wafer 102 is a target of recipe correction.

Among the lots to be plasma-processed in this apparatus, there may be a lot to which APC is not applied; in such a case, the processing described in this embodiment is not performed. Then, when a control target lot is processed thereafter, the plasma processing described in this embodiment is applied again. Lots 104, 105, 106, and 107 are the lots processed in the processing chamber in the past; the lot 104 is a lot plasma-processed before the control target lot 101, the lot 105 is a lot plasma-processed before the lot 104, the lot 106 is a lot plasma-processed before the lot 105, and the lot 107 is a lot plasma-processed before the lot 106.

The aging 103 is plasma processing performed to recover (stabilize) the condition (environment) in the processing chamber before a plurality of product wafers 102 are processed. A monitor value acquisition unit 108, which is a waiting time monitoring unit, acquires as a monitor value a time period from the time when the plasma processing in the processing chamber for the lot 104 processed in the past is completed until the time when the plasma processing for the current control target lot 101 is started. Hereinafter, this is called a waiting time 109. In a first correction amount calculation unit 110, a correlation between the waiting time and a correction amount of a particular recipe item is stored in advance as a control model.

Figure 6:
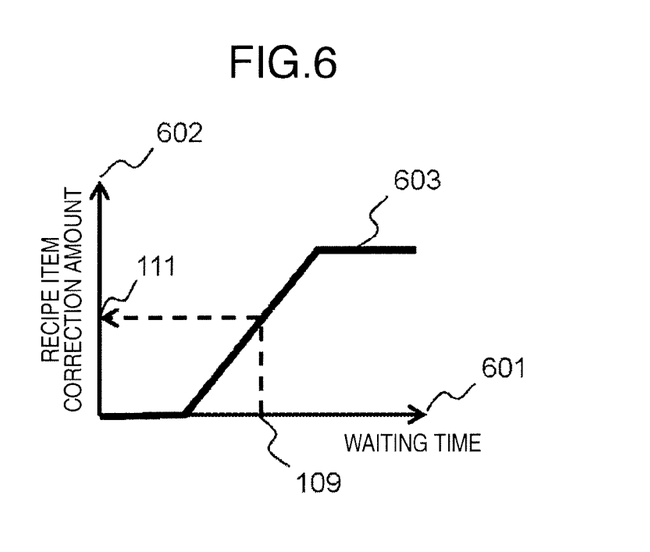
FIG. 6 is a graph showing a correlation (control model) between a waiting time and an amount of correction.

Here, the correction amount of a particular recipe item is, for example, the amount of change from the central condition of the step time in a temperature-raising step performed to raise the temperature in the processing chamber during the aging 103. An example of this control model is shown in FIG. 6. The correlation between a waiting time 601 and a recipe item correction amount 602, that is, for example, a time in a particular step in the aging, is represented by a control model 603. Namely, when the waiting time 109 is acquired, a correction amount 111 from the central condition of the recipe item is determined according to the control model 603. In this manner, the first correction amount calculation unit 110 calculates the recipe correction amount 111 from the acquired waiting time 109 using the corresponding control model.

The calculated recipe correction amount 111 may be applied to the recipe of the aging 103; however, the effect of the most recent waiting time 109 is considered in the recipe correction amount 111, while the effect of the lots processed in the past is not. Therefore, a recipe history coefficient acquisition unit 112 acquires the sequence recipe (A) of the lot 104, which was processed before the control target lot 101, from a process history database 113. In the recipe history coefficient acquisition unit 112, a plurality of recipe history coefficient tables are stored in advance for each sequence recipe of the control target or for each group of them.

In this table, the recipe history coefficients (R) are set for each sequence recipe processed in the past. Because the sequence recipe of the control target lot is A at the moment in this embodiment, a recipe history coefficient table 121 corresponding to it is selected. Using the recipe history coefficient table 121, the value of 0.4 is obtained as a recipe history coefficient (R) 114 for the sequence recipe (A).

Incidentally, a lot that affects the current processing is not limited to the lot processed immediately before. How many lots processed in the past should be considered is determined by the degree of influence onto the control target lot 101. In this embodiment, the lots 104, 105, 106, and 107 processed in the past are considered. Therefore, in the same manner as described above, the value of −1 is obtained as the recipe history coefficient (R) 114 for the sequence recipe (D) of the lot 105 processed in the past; similarly, the value of 1 as the recipe history coefficient (R) 114 for the lot 106, and the value of 0.4 as the recipe history coefficient (R) 114 for the lot 107 are obtained, respectively.

As described above, the recipe history coefficient 114 is a correction coefficient determined for each sequence recipe, which is a numeric value indicating how much effect a plasma processing condition processed in the past will have on the current plasma processing. For example, when the plasma source power is high in a recipe configured in the sequence recipe of the lot plasma-processed immediately before, it is considered that the temperatures of the parts in the processing chamber have been raised high and, therefore, the effect on the current processing is small even when there is a certain waiting time of the processing chamber.

However, when the plasma source power is low in the recipe plasma-processed immediately before, the temperatures of the parts in the processing chamber do not rise greatly and the waiting time of the processing chamber, which is not a problem in the case described above, has a significant effect on the current processing. As another example, the effect on the current processing greatly differs between a plasma processing in a gas chemistry where the amount of deposition onto the inner wall of the processing chamber is large and a plasma processing in a gas chemistry where the inner wall of the processing chamber is cleaned conversely, in recipes of plasma processing performed in the past.

Thus, a recipe item that affects the current plasma processing as the plasma process history is quantified with a numerical value based on the relative difference between recipes and on the degree of influence onto the plasma processing and it is presented as a coefficient, which becomes the recipe history coefficient (R) 114.

Incidentally, there is an occasion when the sequence may be slightly changed even in the same sequence recipe, for example, when the aging is not included depending on the parameter settings of the apparatus and, therefore, the recipe history coefficient 114 may be changed according to such a difference. That is, the degree of influence on the current plasma processing differs according to whether the aging is included or not and the recipe history coefficients 114 would differ. Therefore, such a difference is set in the recipe history coefficient acquisition unit 112.

In a wafer history coefficient acquisition unit 115, a wafer history coefficient is set for the number of wafers processed from the present back to a particular plasma processing in the past, and a plurality of wafer history coefficient tables are stored in advance for each sequence recipe of the control target or for each group of them. In this embodiment, because the sequence recipe of the control target lot 101 is A at this time, a wafer history coefficient table 122 is applied to it. Also, up to which wafer history coefficient of the plasma processing in the past is to be applied is determined in this table considering the degree of influence on the control target lot.

For a wafer history coefficient (W) 116 in this embodiment, the wafer history coefficient table 122 is referenced; the value of 0.1 is applied to the plasma processings of the 1st to 25th wafers as being counted from the present towards the past; similarly, the value of 0.02 to the plasma processings of the 26th to 50th wafers, the value of 0.01 to the plasma processings of the 51st to 75th wafers, the value of 0.005 to the plasma processings of the 76th to 100th wafers, and the value of 0 to the plasma processings of the 101st and subsequent wafers are applied, respectively. In this embodiment, performed plasma processing before the control target lot 101 were the lot 104 containing 25 wafers to be processed, the lot 105 containing 25 wafers to be processed, the lot 106 containing 25 wafers to be processed, and the lot 107 containing 25 wafers to be processed; the wafer history coefficient (W) is applied to each lot according to the number of respective wafers to be processed.

Figure 2:
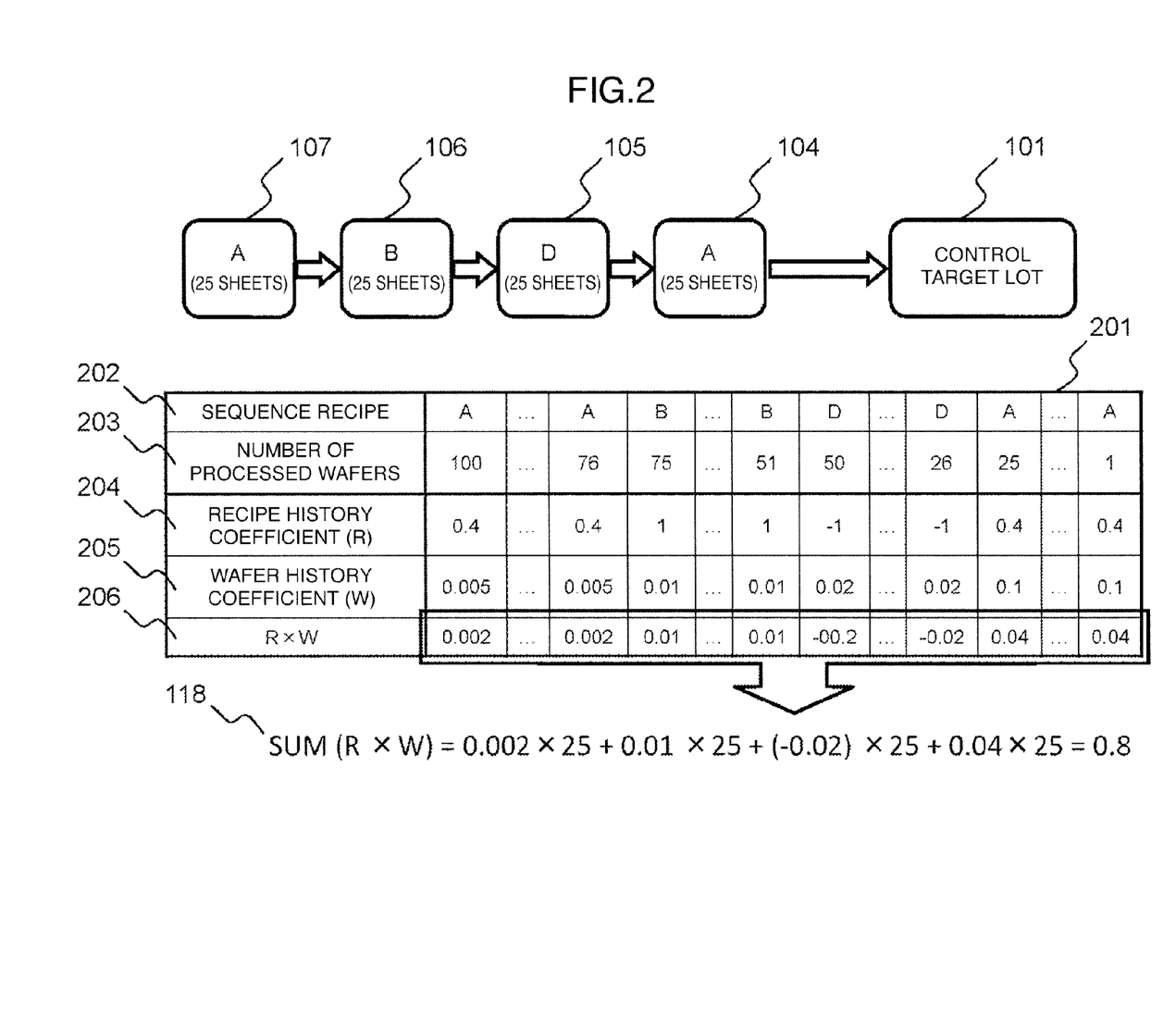
FIG. 2 is a diagram showing a method for calculating a history coefficient in Embodiment 1.

It is noted that, usually, for more recent plasma processings, the degree of influence onto the control target lot is higher and the wafer history coefficient is greater, while for processing further in the past the degree of influence is lower and the wafer history coefficient is smaller. Also, unlike in this embodiment, the wafer history coefficient table may be specified as an arithmetic expression such as an exponential function. A history coefficient calculation unit 117 acquires the recipe history coefficients output from the recipe history coefficient acquisition unit 112 and the wafer history coefficients output from the wafer history coefficient acquisition unit 115 and calculates a history coefficient 118 using them. FIG. 2 is a diagram showing a method for calculating the history coefficient 118 using a table.

The history coefficient calculation unit 117 has a storage unit and expands data into the storage unit from the acquired information as shown in a table 201. In the expanded table 201, a row 204 of the recipe history coefficient (R) corresponding to a row 202 of the sequence recipe information and a row 205 of the wafer history coefficient (W) corresponding to a row 203 of the number of processed wafers are expanded. For each expanded column, a product (R×W) 206 of the recipe history coefficient (R) and the wafer history coefficient (W) is calculated. Then, the sum (SUM(R×W)) of the products becomes the history coefficient 118.

A second correction amount calculation unit 119 calculates an adjusted recipe correction amount 120, which is the second correction amount, from the product of the calculated recipe correction amount 111 and the calculated history coefficient 118. And then, the calculated adjusted recipe correction amount 120 is applied to the recipe of the aging 103 of the control target lot 101. Alternatively, the second correction amount calculation unit 119 may select another recipe which has a value close to the calculated adjusted recipe correction amount 120 from a group of recipes stored in advance. Then, the selected recipe is applied to the aging 103 of the control target lot 101.

Figure 3:
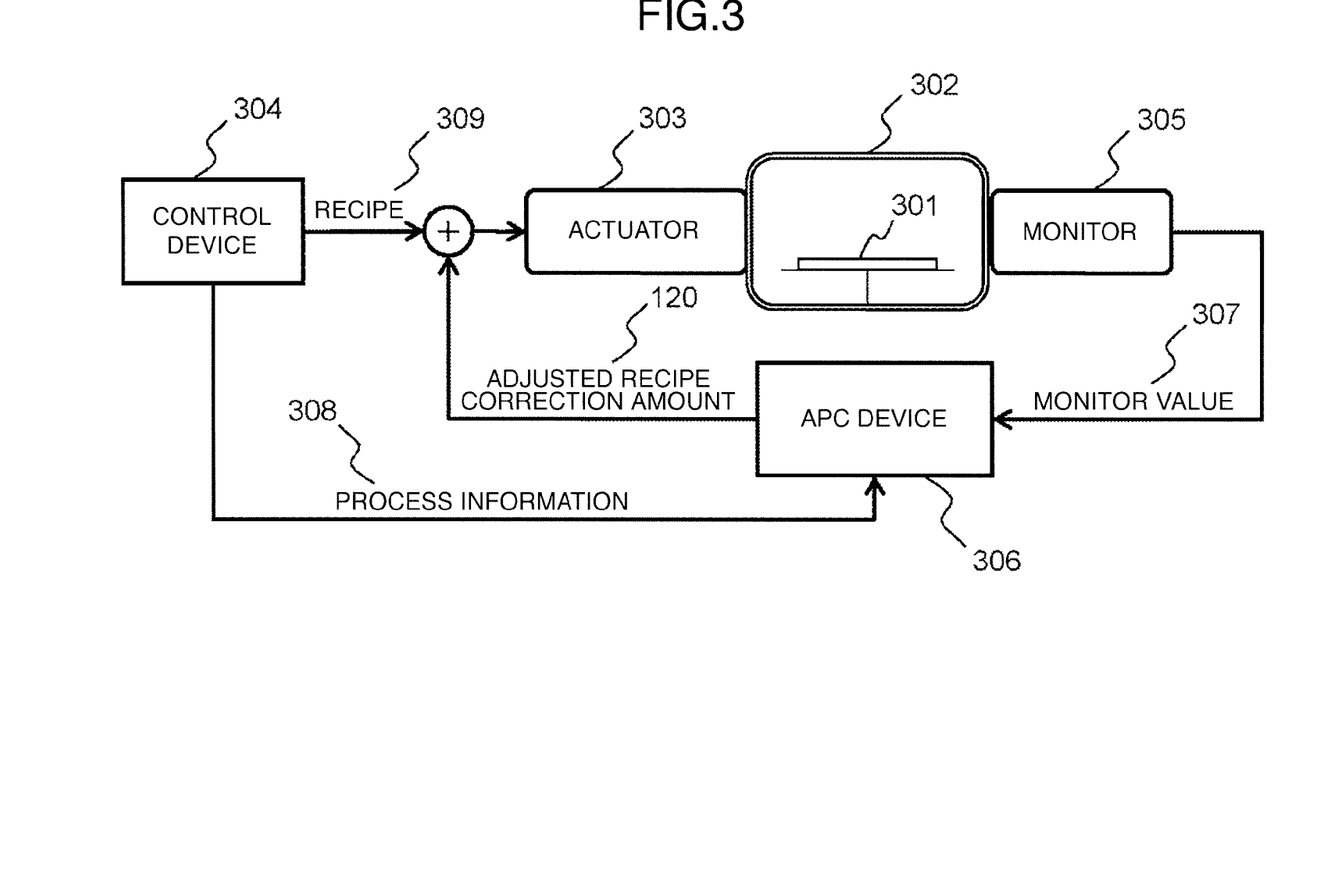
FIG. 3 is a diagram showing a configuration in which the present invention is applied to a control system of a plasma etching apparatus.

The processings described above are repeated for each processing of the subsequent control target lot to perform APC for each plasma processing. FIG. 3 is a diagram showing a configuration in which the embodiment of control according to the present invention, shown in FIG. 1 and FIG. 2, is applied to a control system of a plasma etching apparatus.

A wafer 301, a sample for which the plasma etching processing is performed, is transferred to a processing chamber 302 and is mounted on a stage in the processing chamber 302. Then, plasma for the plasma etching processing is generated in this processing chamber and the plasma processing is performed. At this time, an actuator 303 controls the processing chamber 302 according to a recipe specified by a control device 304. Incidentally, the actuator has a plasma-generation radio-frequency power supply for generating plasma, a mass flow controller for controlling gas flow rates, a radio-frequency power supply to supply radio-frequency power to the wafer 301, and the like.

A process monitor 305 is a sensing means for monitoring various environmental conditions in the processing chamber 302. In this embodiment, it acquires the waiting time 109, which is from the time when the preceding plasma processing is completed to the time when the current plasma processing is started and transmits its value to an APC device 306 as a monitor value 307, in the same manner as with the monitor value acquisition unit 108 shown in FIG. 1.

The APC device 306, which functions as a plasma processing control device, includes the first correction amount calculation unit 110, the recipe history coefficient acquisition unit 112, the process history database 113, the wafer history coefficient acquisition unit 115, the history coefficient calculation unit 117, and the second correction amount calculation unit 119, out of the configuration shown in FIG. 1. It also has the functions, usually installed on a standard computer, such as a storage unit, an operation unit, an input unit, a display unit, and the like to perform these processings. In addition, the APC device 306 may further include a third correction amount calculation unit 125 (not shown), which calculates a further adjusted recipe correction amount 124 (not shown) that is a third correction amount reflecting the plasma processing contents of the control target lot 101 on the adjusted recipe correction amount 120 that is the product of the recipe correction amount 111 and the history coefficient 118.

The APC apparatus 306 calculates a value (adjusted recipe correction amount) 120 for correcting a recipe, in which a plasma processing is to be performed, based on the signal (monitor value) 307 transmitted from the process monitor 305 and information (recipe information and process history information on a lot to be plasma processed) 308, which is transmitted from the control device 304, regarding the current plasma processing. Then, it operates to correct a recipe 309 specified by the control device 304 with the adjusted recipe correction amount 120.

Incidentally, while FIG. 3 shows the configuration in which the APC device 306 is added to the plasma etching apparatus, it may be configured to be integrated inside the control device 304. Otherwise, it may exist separately from a semiconductor fabrication apparatus and may be integrated in a device management/integration system such as a system called Manufacturing Execution System (MES).

Figure 4:
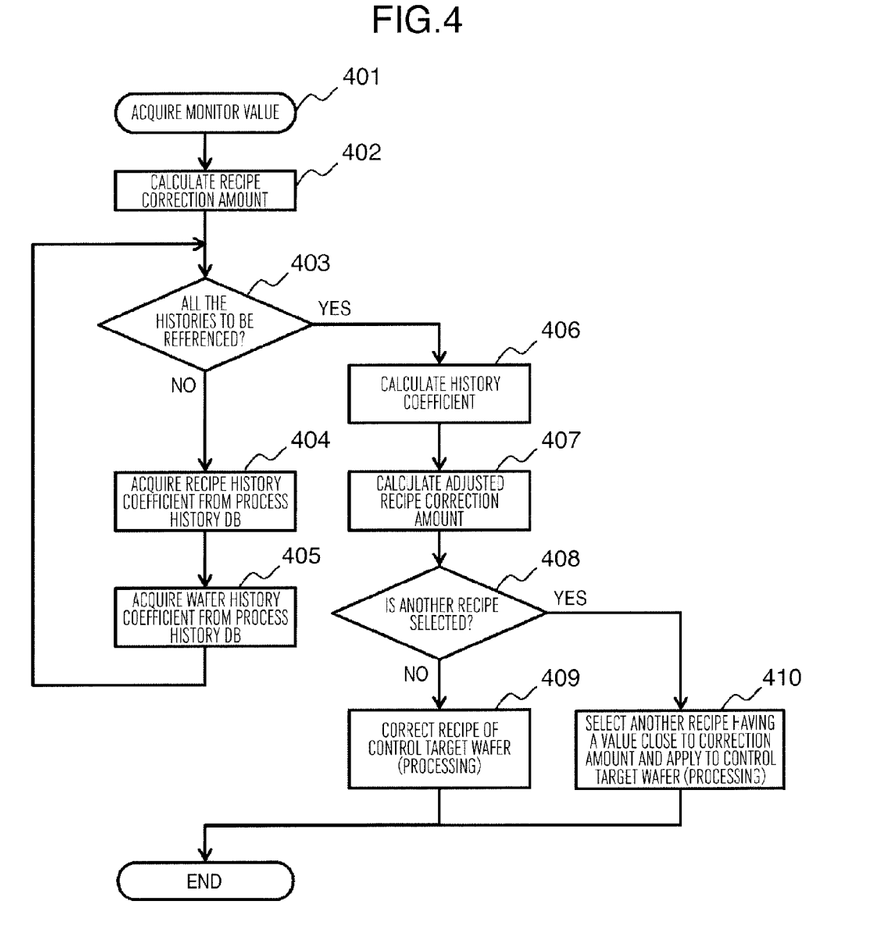
FIG. 4 is a diagram showing a flowchart of plasma processing according to the present invention.

FIG. 4 is a flowchart showing an embodiment of control when the present invention is applied to the plasma etching processing shown in FIG. 1.

First, in Step 401, the monitor value acquisition unit 108 acquires the time period from the time when the processing of the lot 104 processed in the past is completed until the time immediately before the control target lot 101 is processed as a monitor value (waiting time). Next, in Step 402, the first correction amount calculation unit 110 calculates the recipe correction amount, which is the first correction amount, from the monitor value acquired in Step 401. Consequently in Step 403, the wafer history coefficient acquisition unit 115 selects a wafer history coefficient table that is stored in advance for each sequence recipe or for a group of them of the control target and then determines whether the number of past processing histories to be referenced is reached. If it has not reached, it proceeds to Step 404, and, if it has reached, it proceeds to Step 406.

Next, in Step 404, the recipe history coefficient acquisition unit 112 acquires the sequence recipe information on a lot processed before the control target lot from the process history database 113, acquires the recipe history coefficient 114 corresponding to the acquired sequence recipe from the recipe history coefficient table 121 that is stored in advance, and retains. Consequently in Step 405, the wafer history coefficient acquisition unit 115 acquires the number of processed wafers of the respective processings of the lot processed before the control target lot from the process history database 113, acquires the wafer history coefficient 116 corresponding to the number of processed wafers from the wafer history coefficient table 122 that is stored in advance, and retains.

Next, in Step 406, the history coefficient calculation unit 117 calculates the history coefficient 118 using the recipe history coefficient 114 retained in Step 404 and the wafer history coefficient 116 retained in Step 405. Next, in Step 407, the second correction amount calculation unit 119 calculates the adjusted recipe correction amount 120, which is the second correction amount, from the product of the recipe correction amount 111 calculated in Step 402, and the history coefficient 118 calculated in Step 406.

Consequently in Step 408, with regard to a method of recipe determination, it proceeds to Step 409 if a particular item of the recipe for the plasma processing of the control target wafer is corrected and it proceeds to Step 410 if the recipe is not corrected but another recipe is selected from a group of recipes stored in advance.

Next, in Step 409, the adjusted recipe correction amount 120 calculated in Step 407 is applied as a correction amount of the recipe of the plasma processing for the control target wafer. In Step 410, a recipe which has a value close to the adjusted recipe correction amount 120 calculated in Step 407 is selected from a group of recipes registered in advance, and the selected recipe is applied to the plasma processing for the control target wafer.

The steps described above are performed repeatedly for each control target processing of the control target lot to perform APC according to the present invention. In this embodiment, the monitor value acquisition unit 108 is described as a unit which acquires the waiting time 109 as the monitor value; however, in the present invention, the monitor value acquisition unit 108 may acquire plasma light emission data during the plasma processing of the product wafer plasma-processed in the past as the monitor value, instead.

This embodiment is described for the case in which the control target recipe is a recipe of the aging; the present invention, however, may be applied also to a case in which the control target recipe is a recipe of plasma processing for a product wafer. The following describes an embodiment of such a case.

Embodiment 2

Figure 5:
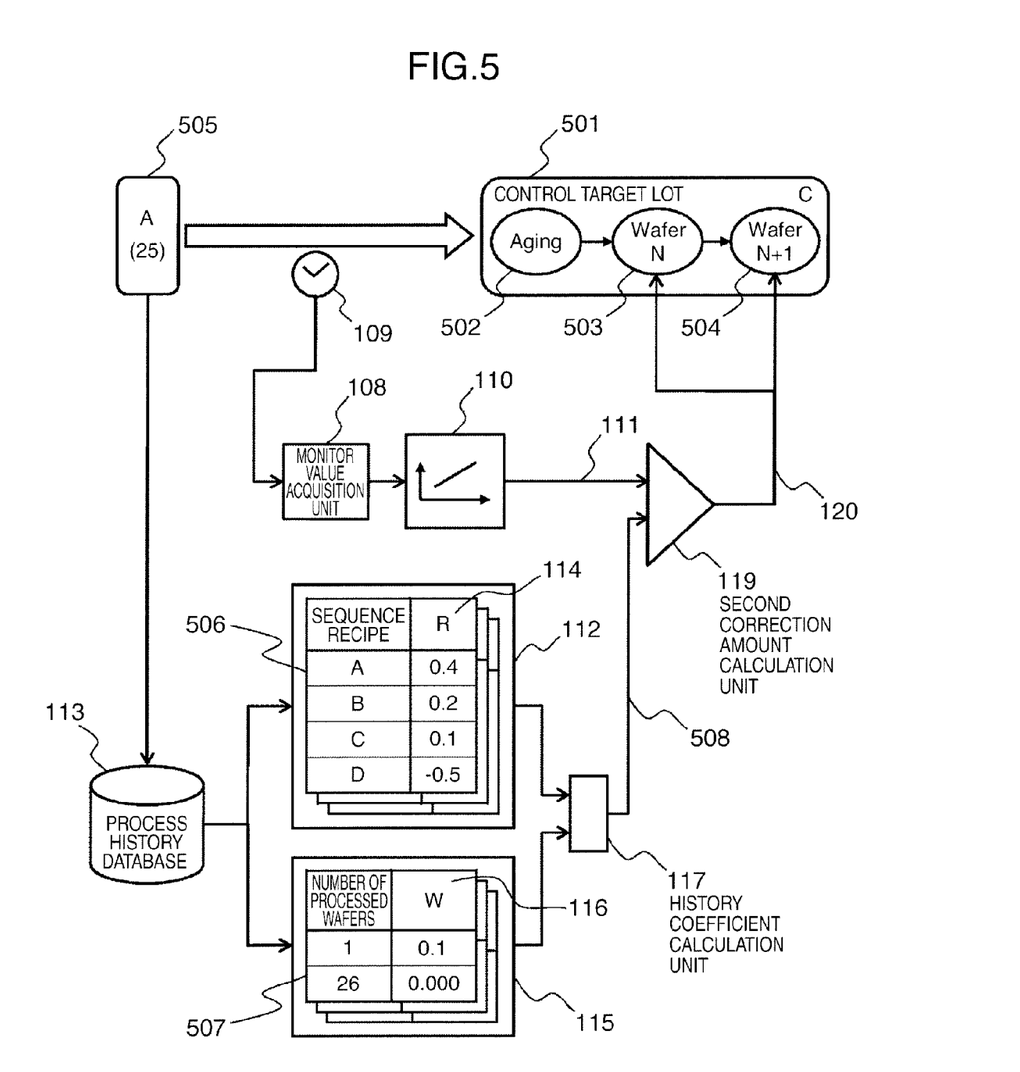
FIG. 5 is a diagram showing a concept of a control system in Embodiment 2.

FIG. 5 is a diagram showing an embodiment of control in which the present invention is applied with the control target in FIG. 1 replaced with a plasma processing condition for a product wafer. With reference to FIG. 5, only the changes from Embodiment 1 are described. A description of element in FIG. 5 that has the same reference numeral and performs the same operation as in FIG. 1 is omitted.

A control target lot 501 is constructed by aging 502 and a plurality of product processings 503 and 504. In Embodiment 1, the aging in the control target lot 501 is taken as the control target as described above; in this embodiment, however, a product wafer processing condition is taken as the control target. A lot 505 is a lot that was plasma processed in the processing chamber using a sequence recipe (A) before the lot 501; in this embodiment, only the lot 505, which was plasma processed immediately before the control target lot 501, is considered as the target of the plasma process history.

The monitor value acquisition unit 108 acquires the time period from the time when the processing of the lot 505, which is before the plasma processing of the lot 501, is completed until the time when the aging 502, which is processed first in the control target lot 501, is started as the waiting time 109. In the first correction amount calculation unit 110, a control model between the waiting time and a recipe for the product wafer processing 503 is stored in advance. A correlation between the waiting time and a recipe item of the product wafer processing, for example, a gas flow rate in a particular step, is stored as a control model. Namely, when the waiting time 109 is acquired, the correction amount 111, which is the first correction amount of the recipe item, is determined using the control model.

The recipe history coefficient acquisition unit 112 acquires the sequence recipe (A) of the lot 505 processed immediately before the control target lot 501 from the process history database 113. A plurality of recipe history coefficient tables are stored in advance for each sequence recipe or for each group of them of the control target. In this table, the recipe history coefficient (R) is stored for each sequence recipe processed in the past. In this embodiment, the sequence recipe of the control target lot is C at the moment and a recipe history coefficient table 506 corresponding to it is selected. Because the sequence recipe of the lot 505 processed in the past is A, the recipe history coefficient (R) 114 corresponding to the sequence recipe (A) is determined as 0.4 from the recipe history coefficient table 506.

The sequence recipe of the control target lot 501 is C at the moment in this embodiment and the wafer history coefficient acquisition unit 115 selects a corresponding wafer history coefficient table 507. The wafer history coefficient (W) 116 in this embodiment is determined by referencing the wafer history coefficient table 507; the value of 0.1 is applied to the plasma processings of the 1st to 25th wafers as being counted from the present towards the past, and the value of 0 to the plasma processings of the 26th and subsequent wafers is applied. Namely, only the plasma processings of the 25 wafers (one lot) performed plasma processing in the past are adopted as the past history.

The history coefficient 508 in this embodiment is calculated and determined in the same manner as in the method shown in FIG. 2. Other than those described above, the control as described in Embodiment 1 is performed and, even in this embodiment, it is repeated for each plasma processing of the control target lot after those described above to perform APC for each plasma processing.

The present invention is implemented as described in Embodiment 1 and Embodiment 2 above; thus, a recipe can be determined based on the processing environment in the processing chamber that varies according to the past plasma process history, so that stable, desired plasma processing performance can be obtained. Although an example of a plasma etching apparatus is described in the above embodiments, the present invention is applicable to the plasma processing apparatuses in general, such as a plasma aching apparatus and a plasma Chemical Vapor Deposition (CVD) apparatus, which perform the processing using plasma.

Note that, the present invention is not limited to the above-described embodiments, but includes various modifications. For example, though the above embodiments have been described in detail in order to facilitate description of the present invention, it is not necessarily limited to the embodiments including all the described configurations. Moreover, it is possible to replace a part of the configuration of a certain embodiment with a configuration of another embodiment, and it is also possible to add a configuration of another embodiment to the configuration of a certain embodiment. Furthermore, for a part of the configuration of each embodiment, addition, deletion, or replacement of another configuration is possible.

The invention claimed is:

1. A plasma processing apparatus comprising:
a processing chamber in which a sample in a lot, said lot comprising a collection of one or more samples, is plasma-processed using control to reduce a variation in plasma processing with feedback control or feed-forward control;
a first correction amount calculator configured to calculate a first correction amount;
a second correction amount calculator configured to calculate a second correction amount;
a process history database storage device operatively coupled to the first and second correction amount calculators; and
a plasma processing control device coupled to the process history database storage device and configured to control to correct a condition for recovery processing for a first lot based on a waiting time and a content of plasma processing for a second lot, the second lot being a lot for which plasma processing was already performed before the first lot, the waiting time being a time period from a time when plasma processing for the second lot is completed to a time when plasma processing for the first lot is started, the condition for recovery processing for the first lot being plasma processing for recovering a status inside the processing chamber so that said status inside the processing chamber becomes a desired status,
wherein the second correction amount calculator is configured to calculate the second correction amount using the first correction amount, a history coefficient of a plasma processing condition for the second lot stored in the process history database storage device, and a history coefficient regarding a number of sheets of samples of the second lot stored in the process history database storage device, and
wherein the history coefficient of a plasma processing condition is a value indicating a degree of influence of the content of plasma processing for the second lot on the variation in plasma processing, and the history coefficient regarding a number of sheets of samples is a value indicating a degree of influence of the number of samples of the second lot on a variation in plasma processing.

2. The plasma processing apparatus according to claim 1, wherein the plasma processing control device is configured to control based on, further, a content of plasma processing for the first lot.

3. The plasma processing apparatus according to claim 1, wherein the content of plasma processing is a plasma processing condition for the second lot.

4. The plasma processing apparatus according to claim 1, wherein the second lot is a plurality of lots on each of which plasma processing is performed.

5. The plasma processing apparatus according to claim 1, wherein the plasma processing control device comprises:
a waiting time monitoring unit which monitors the waiting time,
a recipe history acquisition unit configured to obtain said history coefficient of a plasma processing condition; and
a wafer history acquisition unit configured to obtain said history coefficient regarding a number of sheets of samples,
wherein the first correction amount calculation unit calculates a first correction amount for the condition for recovery processing using the waiting time and a control model, the waiting time being monitored by the waiting time monitoring unit, the control model indicating a correlation between a waiting time acquired in advance and a correction amount of a prescribed item of the condition for recovery processing, and
wherein the plasma processing control device is configured to correct a pre-set condition for recovery processing for the first lot by the second correction amount.

6. A plasma processing apparatus comprising:
a processing chamber in which a sample in a lot, said lot comprising a collection of one or more samples, is plasma-processed using control to reduce a variation in plasma processing with feedback control or feed-forward control;
a first correction amount calculator configured to calculate a first correction amount;
a second correction amount calculator configured to calculate a second correction amount;
a process history database storage device operatively coupled to the first and second correction amount calculators; and
a plasma processing control device coupled to the process history database storage device and configured to control to select from a plurality of conditions for recovery processing a condition for recovery processing for a first lot based on a waiting time and a content of plasma processing for a second lot, the second lot being a lot for which plasma processing was already performed before the first lot, the waiting time being a time period from a time when plasma processing for the second lot is completed to a time when plasma processing for the first lot is started, the condition for recovery processing for the first lot being plasma processing for recovering a status inside the processing chamber so that said status inside the processing chamber becomes a desired status,
wherein the second correction amount calculator is configured to calculate the second correction amount using the first correction amount, a history coefficient of a plasma processing condition for the second lot stored in the process history database storage device, and a history coefficient regarding a number of sheets of samples of the second lot stored in the process history database storage device, and
wherein the history coefficient of a plasma processing condition is a value indicating a degree of influence of the content of plasma processing for the second lot on the variation in plasma processing, and the history coefficient regarding a number of sheets of samples is a value indicating a degree of influence of the number of samples of the second lot on a variation in plasma processing.

7. The plasma processing apparatus according to claim 6, wherein the plasma processing control device is configured to control based on, further, a content of plasma processing for the first lot.

8. The plasma processing apparatus according to claim 6, wherein the content of plasma processing is a plasma processing condition for the second lot.

9. The plasma processing apparatus according to claim 6, wherein the second lot is a plurality of lots on each of which plasma processing is performed.

\* \* \* \* \*